United States Patent [19]

Cain et al.

[11] Patent Number: 5,434,104
[45] Date of Patent: Jul. 18, 1995

[54] METHOD OF USING CORROSION PROHIBITERS IN ALUMINUM ALLOY FILMS

[75] Inventors: John L. Cain, Schertz; Landon B. Vines, San Antonio; Sigmund Koenigseder, San Antonio; Chang-Ou Lee, San Antonio; Felix Fujishiro, San Antonio, all of Tex.

[73] Assignee: VLSI Technology, Inc., San Jose, Calif.

[21] Appl. No.: 204,829

[22] Filed: Mar. 2, 1994

[51] Int. Cl.$^6$ .............................. H01L 21/44
[52] U.S. Cl. ..................... 437/198; 437/197
[58] Field of Search ................ 437/197, 198

[56] References Cited

U.S. PATENT DOCUMENTS

| | | | |
|---|---|---|---|
| 3,841,127 | 10/1974 | Pashak | 72/47 |
| 3,879,840 | 4/1975 | Ames et al. | 29/589 |
| 4,395,437 | 7/1983 | Knapp | 427/78 |
| 4,433,004 | 2/1984 | Yonezawa et al. | 427/38 |
| 4,845,543 | 7/1989 | Okikawa et al. | 357/67 |
| 4,912,544 | 3/1990 | Onuki et al. | 357/67 |
| 5,019,891 | 5/1991 | Onuki et al. | 357/70 |
| 5,330,851 | 7/1994 | Nakayama et al. | 428/627 |

*Primary Examiner*—Olik Chaudhuri
*Assistant Examiner*—Brian K. Dutton
*Attorney, Agent, or Firm*—Burns, Doane, Swecker & Mathis

[57] ABSTRACT

A method of metalization of semiconductor devices wherein predominantly aluminum metal films incorporate a minor amount of magnesium in admixture with the aluminum, or in layered juxtaposition with the aluminum layer, to provide resistance to corrosion, particularly acidic corrosion.

10 Claims, No Drawings

METHOD OF USING CORROSION PROHIBITERS IN ALUMINUM ALLOY FILMS

FIELD OF THE INVENTION

This invention relates to the prevention of corrosion of the thin metallic films found in semiconductor devices. Typically, such thin metallic films are aluminum or aluminum alloys serving as interconnects.

BACKGROUND OF THE INVENTION

Aluminum is the third most used material employed to fabricate silicon solid state components (the other two being silicon and silicon dioxide). Aluminum is primarily utilized in these applications in thin-film form, and it functions as a material which interconnects the structures of the device formed in the silicon substrate. It has emerged as the most important material for such applications because of its low resistivity and its compatibility with the other two substances. For example, aluminum thin films adhere well to silicon dioxide. During the thermal step that sinters the metal silicon contacts, the aluminum atop the silicon dioxide forms a thin layer of aluminum oxide at the aluminum/silicon oxide interface, and this promotes good adhesion. The material properties of aluminum films which are of most interest for silicon device fabrication are its melting point of about 660° C., the formation of an Al/Si eutectic at about 577° C., its density of 2.70 g/cm$^3$ and its resistivity of 2.7 micro ohms-cm. Aluminum alloys are also often utilized in microelectronic applications, including aluminum with 1 weight percent silicon; aluminum with 2 weight percent copper; aluminum with 4 weight percent copper; aluminum with 1 weight percent silicon and 2 weight percent copper; and aluminum with 1.2 weight percent silicon and 0.15 weight percent titanium. Note that the relative low values of the melting point of aluminum and the Al/Si eutectic temperature, restrict the maximum value of subsequent processing temperatures once the Al film has been deposited.

Aluminum thin-films are deposited as polycrystalline materials, usually in the 0.5–1.5 micron thickness range. Early microelectronic devices utilized evaporation to deposit pure aluminum, Al—Si or Al—Cu alloys, but the stringent alloy-composition requirements of VLSI (and other limitations of evaporation) have made sputtering the dominant PVD technology for aluminum films. The development of magnetron sputtering, which allows aluminum to be deposited at deposition rates up to about 1 micron/min, further decreases the use of evaporated aluminum film deposition. Aluminum alloys are used more frequently than pure aluminum because they possess enhanced properties with certain interconnect requirements, including superior contact formation characteristics and better resistance to electromigration.

Aluminum readily forms a thin native oxide ($Al_2O_3$) on its surface upon its exposure to oxygen, even at room temperature. The presence of this oxide can affect the contact resistance when another metal layer is deposited on the aluminum, and can inhibit both the sputtering of an aluminum target and the etching of aluminum films. Aluminum thin films can also suffer corrosion problems as a result of some fabrication processes. For example, if phosphorus-doped silicon dioxide is deposited onto an aluminum film, phosphoric acid can be formed if moisture is absorbed by the glass. This acid will attack aluminum and cause corrosion. In addition, dry etching of aluminum may leave chlorine residues on the aluminum surfaces. Exposure to ambient moisture can lead to the formation of HCl. If copper is present as an alloy in the aluminum film, severe corrosion can occur (i.e. the $CuAl_2$ compound and the aluminum form microelectrodes of a battery with HCl acting as the electrolyte).

The etching of aluminum and aluminum alloy films is a very important step in the fabrication of integrated circuits. The device density, on many of the most advanced circuits, is limited by the area occupied by the interconnect paths. Anisotropic etching of the metal layers permits the use of small minimum pitches (i.e., the pitch is the sum of the dimensions of a metal line and the space between lines), which increases the interconnect capability. Smaller metal pitches create greater vulnerability to corrosion. Furthermore, the isotropic nature of aluminum wet etching processes renders them inadequate for VLSI applications and therefore there is a need for a directional dry etching process.

Reactive etching of aluminum films using chlorides is commonly practiced. It has been determined that a freshly exposed aluminum surface, uncovered by aluminum oxide will react spontaneously with Cl or molecular $Cl_2$ to form $AlCl_3$, even in the absence of a plasma. If, however, the surface of the aluminum is covered with a thin layer of aluminum oxide, it will not react with Cl or $Cl_2$. Thus, the etching of aluminum films is a 2-step process, involving removal of the native oxide layer, and etching of the aluminum film.

The successful removal of the native oxide is one of the most important steps in achieving an effective aluminum etching process. Removal of aluminum oxide is far more difficult than the etching of pure aluminum, and the thickness of this oxide can vary from run-to-run depending on several factors. Thus, an aluminum etch cycle is observed to begin with an initiation period, during which the native oxide and the moisture from the chamber is slowly removed. The removal can be accomplished by sputtering with energetic ions, a condition that can be established in reactive ion etching systems, or by chemical reduction. The chemical reduction of aluminum oxide requires the availability of oxide reducing species. Again, chlorides are the materials of choice.

Water vapor must be excluded from the etch chamber in order to achieve reproducible aluminum etch processes. If an etch chamber is exposed to ambient after an etch run, moisture can be absorbed on the chamber walls. This condition becomes more severe if the etch product of aluminum, $AlCl_3$, is allowed to deposit on the chamber walls. Such deposition occurs on surfaces maintained at room temperature. $AlCl_3$ is very hygroscopic, and thus absorbs considerable moisture on exposure to the atmosphere. This moisture may be deabsorbed after the plasma is struck. The deposition of $AlCl_3$ also has other deleterious effects on the etch process and several techniques are employed to manage $AlCl_3$. Water vapor in the etch chamber is most effectively reduced by load lock chamber designs.

Small quantities of other materials are added to aluminum to improve some of its properties. That is, 1–2% silicon is often added to prevent the aluminum from spiking through shallow junctions, and 2–4% copper or 0.1–0.5 weight percent titanium are added to enhance the electromigration resistance. Copper forms an etch product with chlorine, CuCl, that is relatively nonvolatile. Thus, copper and chloride containing residues often remain after these alloy films have been dry etched. This makes aluminum-copper alloys more difficult to etch in chlorine plasmas. The degree of difficulty increases with increase in copper concentration, and a 4% copper-containing film poses quite a formidable dry etching challenge. Methods must be employed to promote CuCl deabsorption.

Another problem with etching aluminum is that of post-etch corrosion. This effect arises from the hydrolysis of the chlorine or chlorine-containing residues (mostly $AlCl_3$) which remain on the film sidewalls, substrate or resist after etch. Upon absorbing moisture, these residues form HCl which corrodes the aluminum. The reaction of HCl and aluminum produces more $AlCl_3$ and thus as long as moisture is available, corrosion will continue. The problem is even more severe in the Al—Cu alloys since Al—Cu compounds formed in the film (primarily $CuAl_2$) create a galvanic couple with the aluminum and this drives the corrosion even more rapidly than in pure aluminum films. Consequently, the residual chlorine and ambient moisture level necessary to induce corrosion are much lower when copper is present in the aluminum film.

Various techniques have been suggested to deal with post-etch corrosion, all involving the removal of the chlorinated species. These include: (a) removing the wafers from the chamber and rinsing in cold deionized water; (b) plasma ashing of the resist in an oxygen plasma before removal from the etched chamber, which removes the chlorine present in the resist, and restores the passivating aluminum oxide layer; and (c) exposing the aluminum to a fluoride-containing plasma before removal from the chamber which causes the chemically absorbed chlorine to be replaced with fluorine thereby passivating the aluminum by the formation of nonhygroscopic $AlF_3$. Use of $CHF_3$ as a source of fluorine is thought to deposit a column of film over the aluminum, thus sealing the surface and preventing moisture from penetrating to the chlorine residues. However, long term reliability studies on the effectiveness of these treatments, especially on circuits and plastic packages, have yet to be reported.

It would be advantageous if the corrosion of metal lines in semiconductor devices could be inhibited or altogether prohibited. Corrosion is believed to have the following causes:

1. Transport of moisture and such contaminants as Cl through the passivation layer, and subsequent reaction of these with the metal lines. The moisture and contaminants may exist in the package material itself or may arrive through cracks in the package.
2. Leaching of phosphorus from phosphorus-doped $SiO_2$ intermetal or passivation dielectric layers, followed by reaction of the phosphorus with absorbed moisture to form phosphoric acid which then attacks the aluminum lines.
3. Residual Cl which remains on the surface following a Cl-based dry-etch process, reacts with moisture to form HCl, which then attacks the aluminum.

As stated, the standard way of dealing with the later problem has been to expose the wafer to a short, in situ $CHF_3$ or $CF_4$ etch step after the aluminum has been patterned and the resist has been dry etched. A recently reported alternative technique uses a reactor that contains an integrated spin-rinse system in the exit load lock, which sequentially dispenses an organic solvent and water onto the wafer. This technique is believed to remove the carbonaceous chlorine-containing polymer that remains on the wafer following the etch process.

It would be advantageous if an inherently corrosion resistant metal film layer could be found.

SUMMARY OF THE INVENTION

Corrosion prevention is very important in the manufacture of semiconductor products. Degradation of metallic leads through corrosion results in reliability failure of such devices. Much effort has been expended upon trying to slow the rate of corrosion or minimize its impact on the functioning of semiconductor devices. The method and products of the present invention provide a high degree of corrosion inhibition of aluminum and aluminum alloy metal lines in semiconductor devices and surprisingly can even prohibit such corrosion entirely.

The present invention is directed to the fabrication of high-performance semiconductor devices by means of the method including the following step: forming a predominantly aluminum metal film on the surface of a semiconductor device wherein said metal film includes a minor amount of magnesium in admixture with said aluminum.

The amount of magnesium used in admixture with aluminum or aluminum alloys is a corrosion prohibiting amount. Preferably, the amount of magnesium included in admixture with aluminum or aluminum alloy is sufficient to protect the metal from corrosion in an acidic environment. Typically from 0.1 to 5 weight percent of magnesium based on the total weight of the metal film is used within the scope of the present invention.

The predominantly aluminum metal film of the present invention may also contain a minor amount of metal selected from the group consisting of copper, silicon, titanium, tungsten and mixtures thereof. The metal film may be an alloy of copper containing from about 0.5 to about 5 weight percent copper based on the weight of said metal film.

In the practice of the present invention, the metal film may be deposited on the semiconductor device by sputtering or evaporation. Application by sputtering is preferred.

In another aspect, the present invention includes a method of forming a predominantly aluminum metal film on the surface of a semiconductor device with the additional step of covering said film with an additional film comprising a major amount of magnesium.

In its product aspects, the present invention includes a semiconductor device made according to the latter methods, and in particular, a semiconductor device comprising a thin metal film containing a major amount of aluminum and a minor, corrosion inhibiting, amount of magnesium.

DETAILED DESCRIPTION OF PREFERRED EMBODIMENTS OF THE INVENTION

The metalization technique of the present invention gives a higher reliability to VLSI devices due to its ability to decrease the corrosion of the metal interconnecting films. However, before proceeding with a further description of the method and product of this invention, the following terms will be defined:

The term "silicon wafer" refers to a section of crystalline silicon which has been polished and prepared for the fabrication of semiconductor devices upon its surface.

The term "silicon oxide" or "thermal oxide" all refer to silicon dioxide, SiO₂, a refractory dielectric material often appearing in layers in semiconductor devices. Although there are several ways to produce SiO₂ directly on the silicon surface, it is most often accomplished by thermal oxidation in which the silicon is exposed through an oxidizing ambient at elevated temperatures.

The term "semiconductor device", generally refers to any integrated circuit, or portion thereof, typically fabricated on the surface of a silicon wafer.

The term "resist" or "photoresist" refers to a photosensitive material which is applied as a thin film to the substrate (e.g., SiO₂) and subsequently exposed through a mask containing clear and opaque features that defined a pattern to be created in the resist layer. The areas in the resist exposed to the light are made either soluble or insoluble in a specific solvent known as a developer. Exposure followed by development and stripping of the photoresist gives rise to a patterned resist layer on the substrate.

The term "patterned resist layer" refers to the patterned placement of a resist layer onto the surface of a substrate (e.g. SiO₂) generally for the purposes of etching specific structures into the substrate.

The term "dry non-isotropic etching" or "anisotropic etching", refers to an etching procedure which does not employ liquids to effect etching (hence "dry"); which etch takes place in a substantially non-isotropic manner, as opposed to the isotopic etching produced by wet etch processes. Suitable dry non-isotropic etching procedures are well known in the art and include by way of example reactive ion etching, reactive ion beam etching, electron beam etching, and the like.

The term "etchback" or "partial etch", refers to the incomplete etching of a layer of material towards which the etching process is directed. That is, if the layer of material toward which the etching is directed is 1 micron in thickness, the removal of 5,000 Å of said layer is a partial etching or etchback.

The term "sputtering" is a metallic evaporation method for the deposition of metal surfaces on semiconductor devices. The term sputtering is used to describe the mechanism in which atoms are dislodged from the surface of a material by collision with high energy particles. In general, the sputtering process consists of four steps: (1) ions are generated and directed at a target; (2) the ions sputter target atoms; (3) the ejected atoms are transported to the substrate, where; (4) they condense and form a thin film.

The term "chemical vapor deposition" (CVD) refers to the formation of a non-volatile solid film on a substrate by the reaction of vapor phased chemicals (reactants) that contain required constituents. The reactant gases are introduced into a reaction chamber and are decomposed and reacted at the heated surface to form a thin film. The conditions required to effect such deposition are well known in the art. For example, CVD, low pressure chemical vapor deposition (LPCVD), plasma enhanced chemical vapor deposition (PECVD), photon-induced chemical vapor deposition (PHCVD), and the like are described in "Silicon Processing for the VLSI Era", S. Wolf et al., Vol. I and II, Lattice Press, Sunset Beach, Calif., the disclosure of which is incorporated herein by reference in its entirety.

The term "silicon substrate" refers to any silicon material onto which thin metallic films can be deposited under sputtering or evaporative conditions. The substrate can be pure silicon, a compound of silicon, an alloy of silicon, or can contain silicon only in certain areas on the surface of an otherwise non-silicon substrate.

In a preferred embodiment of the present invention, a very thin capping layer of magnesium is deposited on top of the thin aluminum film as has been previously done with tungsten and titanium capping of aluminum films; reference is made to S. Mack et al. *Proceedings* 3rd International VMIC Conference, Santa Clara, Calif., 1986 p. 65, p. 191 and p. 426, the disclosures of each of which is incorporated herein by reference in its entirety.

In another preferred embodiment, magnesium is selectively deposited onto the patterned aluminum lines as has been accomplished with tungsten, e.g., a thin (80 nm) magnesium layer is deposited onto a thick (150 nm) aluminum layer to result in a film of greatly improved corrosion resistance. Reference is made to the tungsten work reported by H. P. Hey et al., *Tech. Dig.* IEDM, 1986, p.50; and J. L. Yeh, *Proceedings* 4th International VMIC Conference, Santa Clara, Calif., 1987, p. 132, the disclosure of each of which is incorporated herein by reference in its entirety.

In another preferred embodiment of the present invention, a predominantly aluminum metal film is sputtered onto the surface of a silicon substrate. Characteristic of the invention, the metal contains a minor amount of magnesium in admixture with the aluminum.

Methodology

In many sputter deposition applications, it is desired that alloys, rather than pure films be deposited (e.g., in the present instance, aluminum-magnesium alloys, or aluminum-magnesium-other metal alloys). They may be deposited by co-sputtering from multiple targets, but it is more common that single, multi-component targets are used. In steady-state sputtering conditions, the elements are sputtered from the target in the same ratio as are present in the alloy.

When the surface of a metal alloy is initially exposed to the impinging ions in a sputter process, it will have its nominal composition. Depending upon which metal has a higher sputter yield, the ratio of metals will be higher or lower at a given energy of ionic bombardment. But this situation would not persist for very long. As the surface gets relatively depleted of the higher yielding atom, the sputtering rate of the other atoms increases and that of the former decreases, until in the steady-state the material is leaving the surface in the ratio desired. It is useful to use a shutter during the period in which the surface concentration is stabilizing, to prevent deposition of material with non-desired alloy composition onto the substrate.

The composition of the deposited film, however, may not exactly mirror the composition of the target because of other factors. For example, if the alloy constituent atoms differ greatly in mass, the lighter atoms will be more strongly scattered by the argon atoms as they move from the cathode to the substrate. In addition, if bias-sputtering is utilized, resputtering of the deposited film may alter the film composition. Thus, the film composition must be measured for each process condition. Once a set of process conditions is fixed, it is possible to obtain reproducible results from run-to-run.

Aluminum and aluminum alloy films of about 3,000–12,000 Å thickness are deposited by demagnetron sputtering, since high deposition rates are normally required (3,000–10,000 Å/min). Substrate heating and/or bias-sputtering are frequently used to enhance step coverage. Film reflectance and alloy composition to some degree are also impacted by bias-sputtering conditions. Residual gases such as oxygen, nitrogen and hydrogen can cause deleterious effects in the deposited film. To minimize problems from residual gas incorporation, some or all of the following procedures are utilized: (a) the chamber is pumped to a low based pressure before being back-filled with argon at the start of the deposition process; (b) the wafers and wafer holders are preheated in the load-lock chamber to desorb surface moisture; (c) high purity argon gas is used; (d) in some systems titanium sublimation pumps are offered for pumping hydrogen; (e) residual-gas analyzers are used to monitor the gas composition during the sputter process; (f) the chambers pump during the process with a high through put pump so that the residence time of any desorbing contaminant gases is short; and (g) high deposition rate processes are used, so that the growing film is exposed to any impinging contaminant gases for the shortest possible time.

Aluminum alloy films are usually deposited from a single compound target, but successful deposition by co-sputtering has been reported, especially if the alloy material is to be introduced as a series of thin layers. Reference is made to D. R. Denison, "Sputtering System Design for Optimum Deposited Film Quality", *Microelectronics Manufacturing and Testing*, July 1985, p. 12; and R. Nowicki et al., "Dual RF Diode/DC Magnetron Sputtered Aluminum Alloy Films for VLSI", *Semiconductor International*, March 1982, p. 105, the disclosures of each of which is incorporated herein by reference in its entirety. In many cases, an underlying layer, or an overlying layer is applied during the same pump down, and in such instances the sputtering system must have the capability of depositing several materials in a single process.

Evaporation of alloys is a complex process since alloys consist of mixtures of elements that seldom have similar vapor pressures at a given temperature. In addition, Raoults Law states that the vapor pressure of a solution is lower than that of a pure solvent by an amount proportional to the concentration of the solute. Alloy films are therefore evaporated using one of two techniques: (a) evaporation from the single source composed of an alloy, but not necessarily containing the constituents in the same percentage ratio as in the deposited film; and (b) simultaneous co-evaporation using two electron guns and two sources, with each source containing only one of the alloy constituents.

The single-source method is only practical if the vapor pressures are within a factor of 100 of each other at a given temperature. The composition of the film, however, is difficult to control, since as evaporation occurs, the composition of both the source and vapor change continuously. That is, the source becomes richer in the less volatile element. Alloy films of aluminum and 0.5 weight percent copper are typically evaporated using a single source of aluminum and 2 weight percent copper. The dual-source method offers the promise of better control, at the price of added system complexity. In addition, the uniformity of deposition across large substrates from two sources is reduced, and the relative power applied to the two sources must be well controlled to insure that the desired evaporation rates are maintained. By using the two source method, however, it is even possible to codeposit materials that form neither compounds nor solid solutions. Alloys of aluminum and silicon are normally coevaporated in two source systems. On the whole, however, it is significantly more difficult to deposit alloys with highly controlled compositions by their evaporation methods then by sputter deposition. Multi-layer films can be deposited in a system containing several sources and a single electron gun, when several guns can be aimed at multiple crucibles, to evaporate film layers in a planned sequence.

The foregoing methodology will find use in the method of the present invention relating to the formation of a predominantly aluminum metal film on the surface of a semiconductor device wherein said metal film comprises a minor amount of magnesium in admixture with the aluminum. In general, the amount of magnesium used in admixture with the aluminum is a corrosion prohibiting amount of magnesium. Particularly, sufficient magnesium is incorporated to protect the metal film from corrosion in an acidic environment. Magnesium is preferably incorporated in an amount of from about 0.1 to about 5 weight percent of magnesium based on the total weight of the metal film.

The metal film may also contain a minor amount of metal selected from the group consisting of copper, silicon, titanium, tungsten and mixtures thereof. As described in the foregoing methodology, the metal film is deposited on the semiconductor device, normally a silicon substrate by sputtering or evaporation processes. Application by sputtering is preferred.

In a preferred embodiment, an aluminum metal film is formed on the surface of a semiconductor device and an additional layer comprising a major amount of magnesium is formed thereon.

While the invention has been described in terms of various preferred embodiments, the skilled artisan will appreciate that various modifications, substitutions, omissions and changes may be made without departing from the spirit thereof. Accordingly, it is intended that the scope of the present invention be limited solely by the following claims.

What is claimed is:

1. A method of forming a metal film that is resistant to corrosion in an acidic environment on the surface of a semiconductor device comprising the steps of (a) depositing an alloy comprising aluminum and magnesium onto said surface wherein said magnesium constitutes about 0.1 to about 5 weight percent of said metal film based on the total weight of said metal film and (2) thereafter covering said metal film with a second film comprising essentially of said magnesium.

2. A method according to claim 1 wherein the metal film has a thickness of about 3,000–12,000 Å.

3. A method according to claim 1 wherein said metal film also contains a metal selected from the group consisting of copper, silicon, titanium, tungsten and mixtures thereof.

4. A method according to claim 3 wherein said metal film is deposited on said semiconductor device by sputtering or evaporation.

5. A method according to claim 3 wherein the metal film has a thickness of about 3,000–12,000 Å.

6. A method according to claim 1 wherein said metal film is an alloy of copper containing from about 0.5 to about 5 weight percent copper based on the weight of said film.

7. A method according to claim 6 wherein said metal film is deposited on said semiconductor device by sputtering or evaporation.

8. A method according to claim 6 wherein the metal film has a thickness of about 3,000–12,000 Å.

9. A method according to claim 1 wherein said metal film is deposited on said semiconductor device by sputtering or evaporation.

10. A method according to claim 9 wherein the metal film has a thickness of about 3,000–12,000 Å.

* * * * *